(12) United States Patent
Tanase et al.

(10) Patent No.: US 7,282,097 B2
(45) Date of Patent: Oct. 16, 2007

(54) SLIT VALVE DOOR SEAL

(75) Inventors: Yoshiaki Tanase, San Jose, CA (US); William Norman Sterling, Santa Clara, CA (US); Paul Andrew Haworth, Feniscowles (GB)

(73) Assignee: Applied Materials, Inc., Santa Clara, CA (US)

( * ) Notice: Subject to any disclaimer, the term of this patent is extended or adjusted under 35 U.S.C. 154(b) by 390 days.

(21) Appl. No.: 10/867,344

(22) Filed: Jun. 14, 2004

(65) Prior Publication Data

US 2005/0274459 A1 Dec. 15, 2005

(51) Int. Cl.
C23C 16/00 (2006.01)
C23F 1/00 (2006.01)
H01L 21/306 (2006.01)
F16J 15/02 (2006.01)

(52) U.S. Cl. ........... 118/733; 118/719; 156/345.31; 156/345.32; 277/644; 277/648; 277/910

(58) Field of Classification Search ........... 118/719, 118/733; 277/644, 648, 910; 156/345.31, 156/345.32

See application file for complete search history.

(56) References Cited

U.S. PATENT DOCUMENTS

| | | | | |
|---|---|---|---|---|
| 5,390,939 A | * | 2/1995 | Terauchi et al. | 277/650 |
| 5,579,718 A | | 12/1996 | Freerks | |
| 6,053,980 A | * | 4/2000 | Suda et al. | 118/719 |
| 6,074,519 A | * | 6/2000 | Lee et al. | 156/345.47 |
| 6,089,543 A | * | 7/2000 | Freerks | 251/357 |
| 6,173,969 B1 | * | 1/2001 | Stoll et al. | 277/630 |
| 6,305,695 B1 | * | 10/2001 | Wilson | 277/584 |
| 6,932,354 B2 | * | 8/2005 | Kane et al. | 277/608 |

OTHER PUBLICATIONS

Kurita, et al., "Load Lock Chamber for Large Area Substrate Processing System", U.S. Appl. No. 10/832,795 Filed Apr. 26, 2004.

* cited by examiner

*Primary Examiner*—Karla Moore
(74) *Attorney, Agent, or Firm*—Patterson & Sheridan LLP

(57) ABSTRACT

Embodiments of the invention generally provide a slit valve door seal. In one embodiment, a slit valve door seal includes a ring-shaped base having a center axis and at least one finger extending from the base. The finger is oriented substantially parallel to the center axis, wherein the base and the finger define a single, one-piece seal member. The seal is particularly suitable for using in sealing substrate access passages formed in load lock chambers.

22 Claims, 6 Drawing Sheets

SLIT VALVE DOOR SEAL

BACKGROUND OF THE INVENTION

1. Field of the Invention

The embodiments of the invention generally relate to a slit valve door for sealing substrate passages in vacuum processing systems.

2. Background of the Related Art

Thin film transistors (TFT) are commonly used for active matrix displays such as computer and television monitors, cell phone displays, personal digital assistants (PDAs), and an increasing number of other devices. Generally, flat panels comprise two glass plates having a layer of liquid crystal materials sandwiched therebetween. At least one of the glass plates includes one conductive film disposed thereon that is coupled to a power source. Power, supplied to the conductive film from the power source, changes the orientation of the crystal material, creating a pattern display.

With the marketplace's acceptance of flat panel technology, the demand for larger displays, increased production and lower manufacturing costs have driven equipment manufacturers to develop new systems that accommodate larger size glass substrates for flat panel display fabricators. Current glass processing equipment is generally configured to accommodate substrates up to about one square meter. Processing equipment configured to accommodate substrate sizes up to and exceeding 4 square meters is envisioned in the immediate future.

Glass substrate processing is typically performed in a cluster tool by subjecting a substrate to a plurality of sequential processes to create devices, conductors, and insulators on the substrate. Each of these processes is generally performed in a process chamber configured to perform a single step of the production process. In order to efficiently complete the entire sequence of processing steps, the cluster tool includes a number of process chambers coupled to a central transfer chamber. A robot is housed in the transfer chamber to facilitate transfer of the substrate between the process chambers and a load lock chamber. The load lock chamber allows substrates to be transferred between the vacuum environment of the cluster tool and an ambient environment of a factory interface. Such cluster tools for glass substrate processing are available from AKT, Inc., a wholly-owned subsidiary of Applied Materials, Inc., of Santa Clara, Calif.

As the substrate size for manufacturing flat panel display grows, the manufacturing equipment for these substrates becomes larger in size as well. Accordingly, the door or gate that isolates one vacuum chamber (or load lock) from another has became larger, or, specifically longer since the slot opening between the two chambers has to become wider to accommodate the large width of the substrate passing through the slot opening. The increasing length of the door poses a technical challenge for obtaining a good isolation seal between the two chambers, which is maintained by an elastomer seal disposed around the slot opening between the door and a chamber wall.

FIG. 1 depicts a partial sectional view of a substrate passage 108 formed through a load lock chamber body 106 and selectively sealed by a conventional slit valve door 110. A seal 116 is deposed between the door 110 and chamber body 106 to provide a vacuum seal across passage 108. The force required to load the seal 116 in order to obtain good chamber isolation is high.

When a vacuum condition is present within the chamber body 106, the pressure differentials cause the chamber body 106 to distort and move relative to the slit valve door 110. As the seal 116 is typically retained in the slit valve door 110, the movement of the chamber body 106 creates a shearing force on the seal, especially in the center of the door span. Moreover, as the seal 116 is urged in one direction by the chamber body 106, the seal 116 is force against the corners of a seal gland 114 formed in the slit valve door 110. Chafing of the seal 116 against the chamber body 106 and the corner of the seal gland 114 creates unwanted particles that may adversely effect substrate processing. Additionally, the seal 116 may become abraded or damaged by the mechanical interaction with the chamber body 106 and the corner of the seal gland 114, thereby significantly shortening the service life of the seal 116.

Therefore, there is a need for an improved slit valve door seal.

SUMMARY OF THE INVENTION

Embodiments of the invention generally relate to a slit valve door seal. In one embodiment, a slit valve door seal includes a ring-shaped base and at least one finger extending from the base. The base and the finger define a single, one-piece seal member. The finger is oriented substantially parallel to a center axis.

In another embodiment, a chamber having an improved substrate access port seal is provided. In one embodiment, the chamber includes a chamber body having at least one substrate access port passage selectively sealed by a door member. A seal is deposed between the door member and chamber body and includes a ring-shaped base having a center axis and a finger extending from the base and oriented substantially parallel to the center axis. The seal is particularly suitable for using in sealing substrate access ports formed in load lock chambers.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

The invention generally provides an improved slit valve door seal that is particularly suitable for use in large area substrate processing chambers. The invention is illustratively described below as utilized in a flat panel processing system, such as those available from AKT, a division of Applied Materials, Inc., Santa Clara, Calif. However, it should be understood that the invention has utility for sealing substrate transfer passages in other types of processing equipment in other system configurations, including semiconductor processing equipment.

Figure 1:
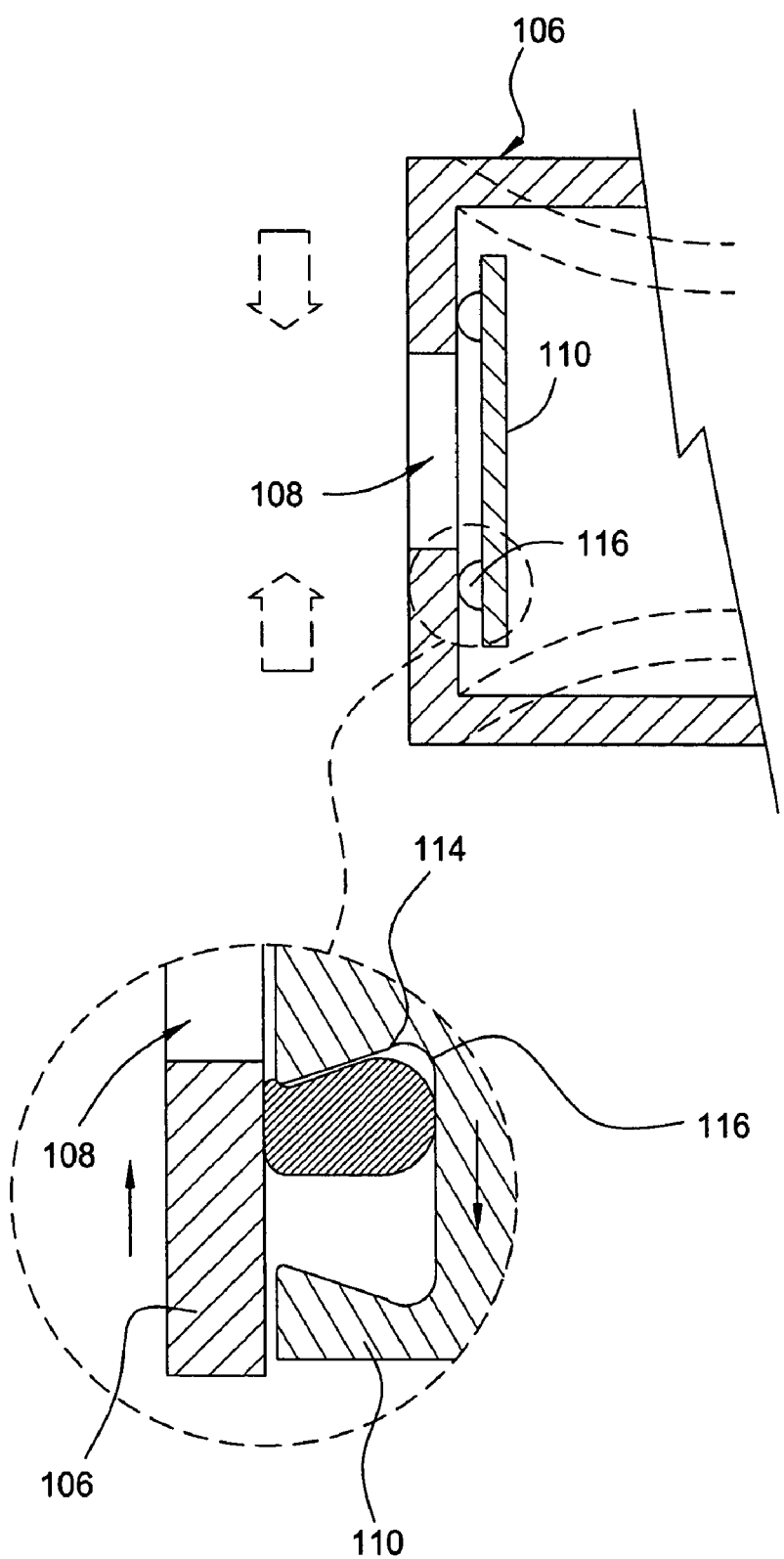
FIG. 1 is partial sectional view of a conventional load lock chamber.
Figure 2:
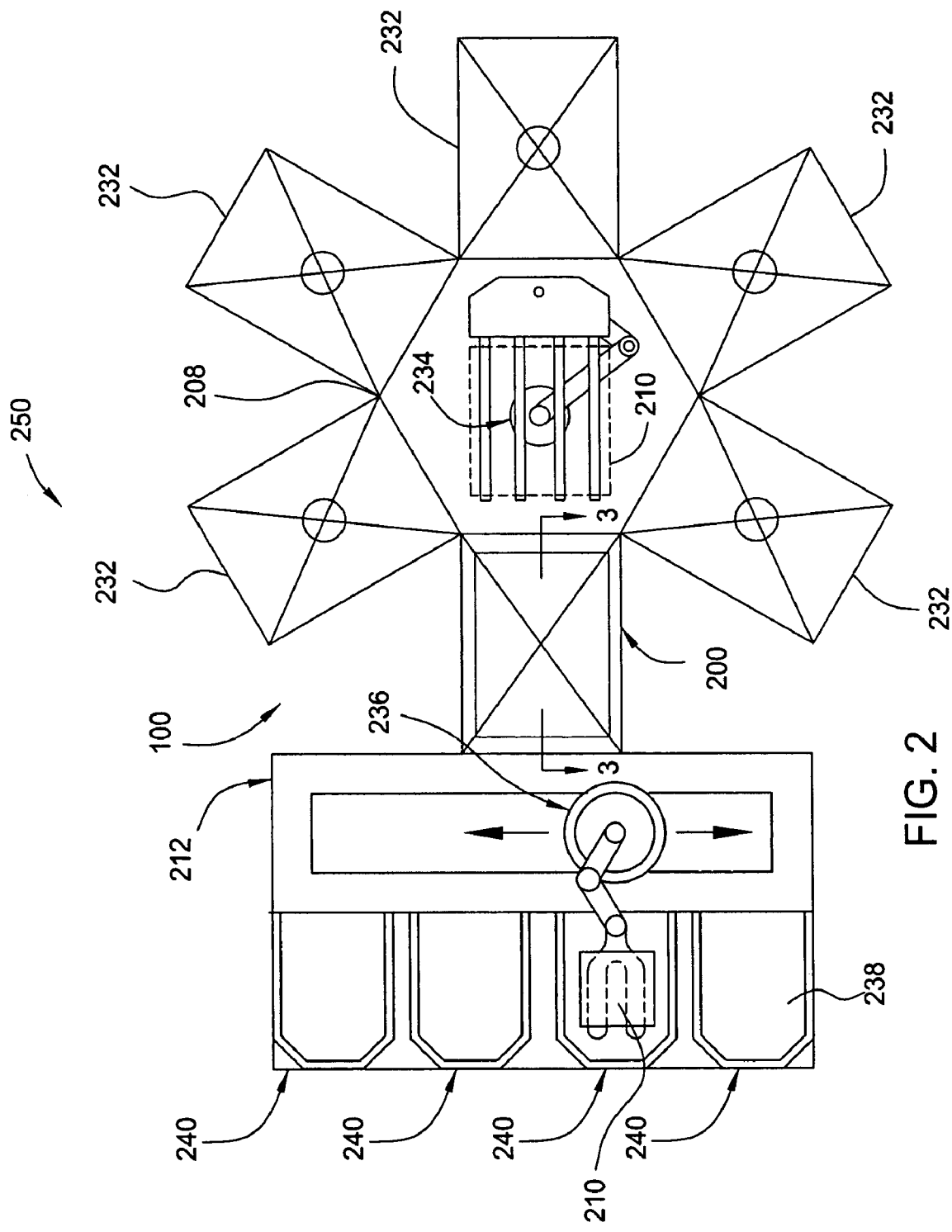
FIG. 2 is a top plan view of one embodiment of a processing system for processing large area substrates having a substrate access port seal of the invention.

FIG. 2 is a top plan view of one embodiment of a process system 250 suitable for processing large area substrates (e.g., glass or polymer substrates having a plan area greater than about 0.25 square meters). The process system 250 typically includes a transfer chamber 208 coupled to a factory interface 212 by a load lock chamber 200. The transfer chamber 208 has at least one vacuum robot 234 disposed therein that is adapted to transfer substrates between a plurality of circumscribing process chambers 232 and the load lock chamber 200. In one embodiment, one of the process chambers 232 is a pre-heat chamber that thermally conditions substrates prior to processing to enhance throughput of the system 250. Typically, the transfer chamber 208 is maintained at a vacuum condition to eliminate the necessity of adjusting the pressures between the transfer chamber 208 and the individual process chambers 232 after each substrate transfer.

The factory interface 212 generally includes a plurality of substrate storage cassettes 238 and at least one atmospheric robot 236. The cassettes 238 are generally removably disposed in a plurality of bays 240 formed on one side of the factory interface 212. The atmospheric robot 236 is adapted to transfer substrates 206 between the cassettes 238 and the load lock chamber 200. Typically, the factory interface 212 is maintained at or slightly above atmospheric pressure.

Figure 3:
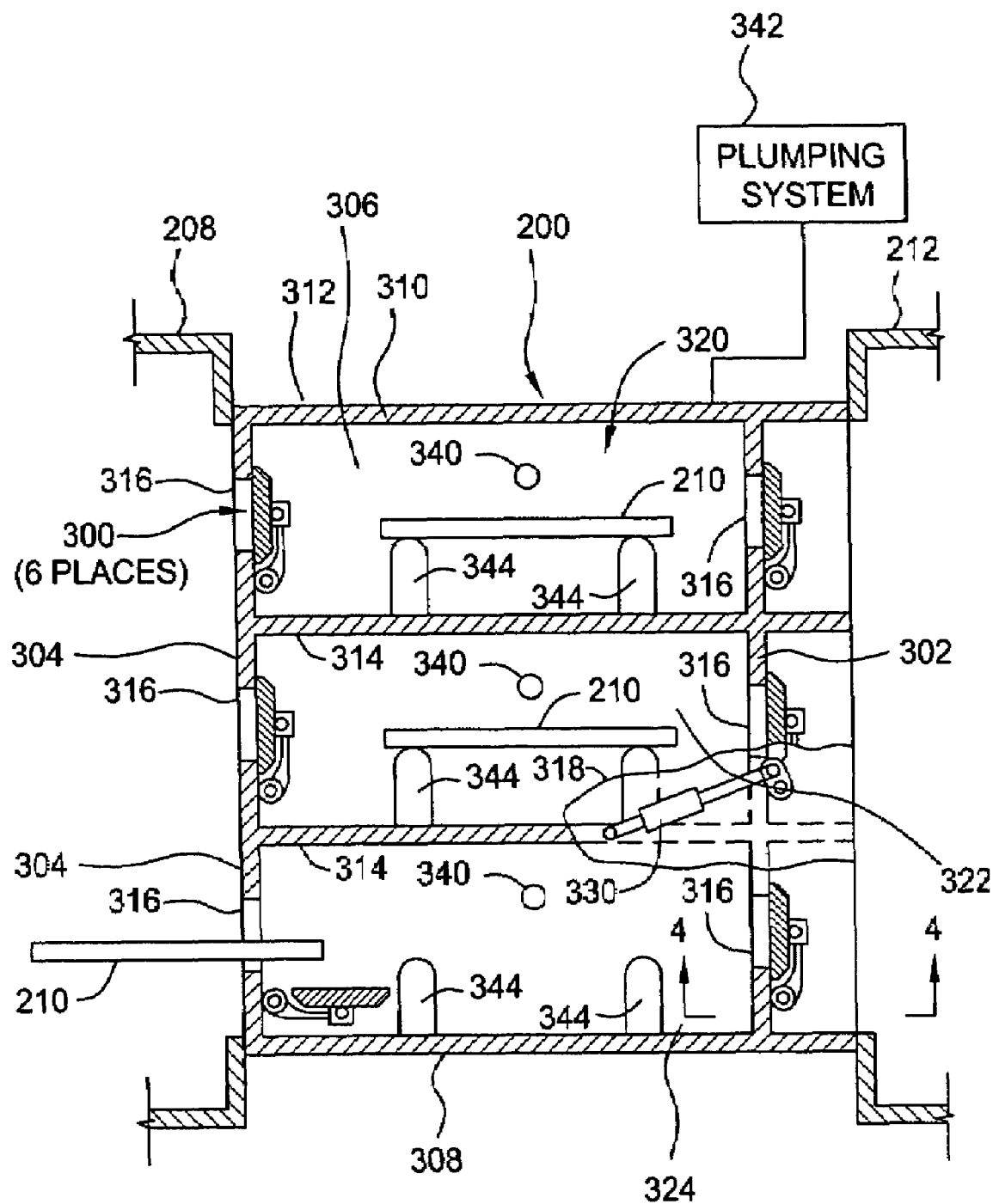
FIG. 3 is a sectional view of the load lock chamber taken along section lines 3-3 of FIG. 2.

FIG. 3 is a sectional view of one embodiment of the load lock 200 of FIG. 2. The load lock chamber 200 includes slit valve door assemblies 300 adapted to seal substrate access ports 316 defined between the factory interface 212 and the transfer chamber 208. One example of a load lock chamber that may be adapted to benefit from the invention is described in U.S. Provisional Application Ser. No. 60/512727, entitled "LOAD LOCK CHAMBER FOR LARGE AREA SUBSTRATE PROCESSING SYSTEM", filed Oct. 20, 2003, by Kurita et al., and U.S. patent application Ser. No. 09/464.362, entitled DUAL SUBSTRATE LOADLOCK PROCESS EQUIPMENT, filed Dec. 15, 1999, by Kurita et al., both of which are hereby incorporated by reference in their entireties. It is contemplated that the slit valve door assembly 300 may be utilized with load lock chambers having alternative configurations. It is also contemplated that the slit valve door assembly 300 may also be utilized to selectively seal substrate ports formed in the transfer chamber 208 or processing chambers 237.

In the embodiment depicted in FIG. 3, the load lock chamber 200 has a chamber body 312 that includes a plurality of vertically-stacked, environmentally-isolated substrate transfer chambers that are separated by vacuum-tight, horizontal interior walls 314. Although three single substrate transfer chambers 320, 322, 324 are shown in the embodiment depicted in FIG. 3, it is contemplated that the chamber body 312 of load lock chamber 200 may include two or more vertically-stacked substrate transfer chambers. For example, the load lock chamber 200 may include N substrate transfer chambers separated by N-1 horizontal interior walls 314, where N is an integer greater than one.

The substrate transfer chambers 320, 322, 324 are each configured to accommodate a single large area substrate 210 so that the volume of each chamber may be minimized to enhance fast pumping and vent cycles. In the embodiment depicted in FIG. 3, each substrate transfer chamber 320, 322, 324 has an interior volume of about 1000 liters to accommodate substrates having a plan surface area of about 3.7 square meters. It is contemplated that a substrate transfer chamber of the present invention having other widths, lengths and/or heights may be configured to accommodate different size substrates.

The chamber body 312 includes first sidewall 302, a second sidewall 304, a third sidewall 306, a bottom 308 and a top 310. A fourth sidewall 318 (partially shown in FIG. 3) is opposite the third sidewall 306. The body 312 is fabricated from a rigid material suitable for use under vacuum conditions. The chamber body 312 is fabricated from a single block (e.g., one piece) of aluminum or other suitable material, or fabricated from modular sections.

The substrate 210 is supported by a plurality of substrate supports 344 above the bottom 308 of the first substrate transfer chamber 320 and the interior walls 314 bounding the bottom of the second and third substrate transfer chambers 322, 324. The substrate supports 344 are configured and spaced to support the substrate 210 at an elevation above the bottom 308 (or walls 314) to avoid contact of the substrate with the chamber body 312. The substrate supports 344 are configured to minimize scratching and contamination of the substrate. In the embodiment depicted in FIG. 3, the substrate supports 344 are stainless pins having a rounded upper end 346. Other suitable substrate supports are described in U.S. Pat. No. 6,528,767, filed Mar. 5, 2003; U.S. patent application Ser. No. 09/982,406, filed Oct. 27, 2001; and U.S. patent application Ser. No. 60/376,857, filed Feb. 27, 2003, all of which are incorporated by reference in their entireties.

At least one of the sidewalls of each of the substrate transfer chambers 320, 322, 324 includes at least one port 340 formed therethrough and coupled to a pumping system 342 to facilitate controlling the pressure within the interior volume of each chamber. The pumping system 342 includes vent, pumps and flow controls that enable the pumping system 342 to selectively vent or pump down a predetermined one of the substrate transfer chambers 320. 322, 324. One example of a pumping system that may be adapted to benefit from the invention is described in the previously incorporated U.S. Provisional Application Ser. No. 60/512, 727, entitled "LOAD LOCK CHAMBER FOR LARGE AREA SUBSTRATE PROCESSING SYSTEM", filed Oct. 20, 2003, by Kurita et al.

Each of the substrate transfer chambers 320, 322, 324 defined in the chamber body 312 includes two substrate access ports 316. The ports 316 are configured to facilitate the entry and egress of large area substrates 210 from the load lock chamber 200. In the embodiment depicted in FIG. 3, the substrate access ports 316 of each of the substrate transfer chambers 320, 322, 324 are disposed on opposite sides of the chamber body 312, however, the ports 316 may alternatively be positioned on adjacent walls of the body 312. In one embodiment, the width of the first and second substrate access port 316, 316 are, but not limited to, at least 1650 millimeters. The access ports 316 are contemplated as being correspondingly small in chambers configured for 200 and 300 mm wafers, and the like.

Each of the substrate access ports 316 are selectively sealed by a respective slit valve door assembly 300 that are adapted to selectively isolate the first substrate transfer chamber 320 from the environments of the transfer chamber 208 and the factory interface 212. Each slit valve door assembly 300 is moved between an open and closed position by at least one actuator 330 (one actuator 330 is normally positioned outside the chamber body 312 on the fourth wall 318 in FIG. 3).

Figure 4:
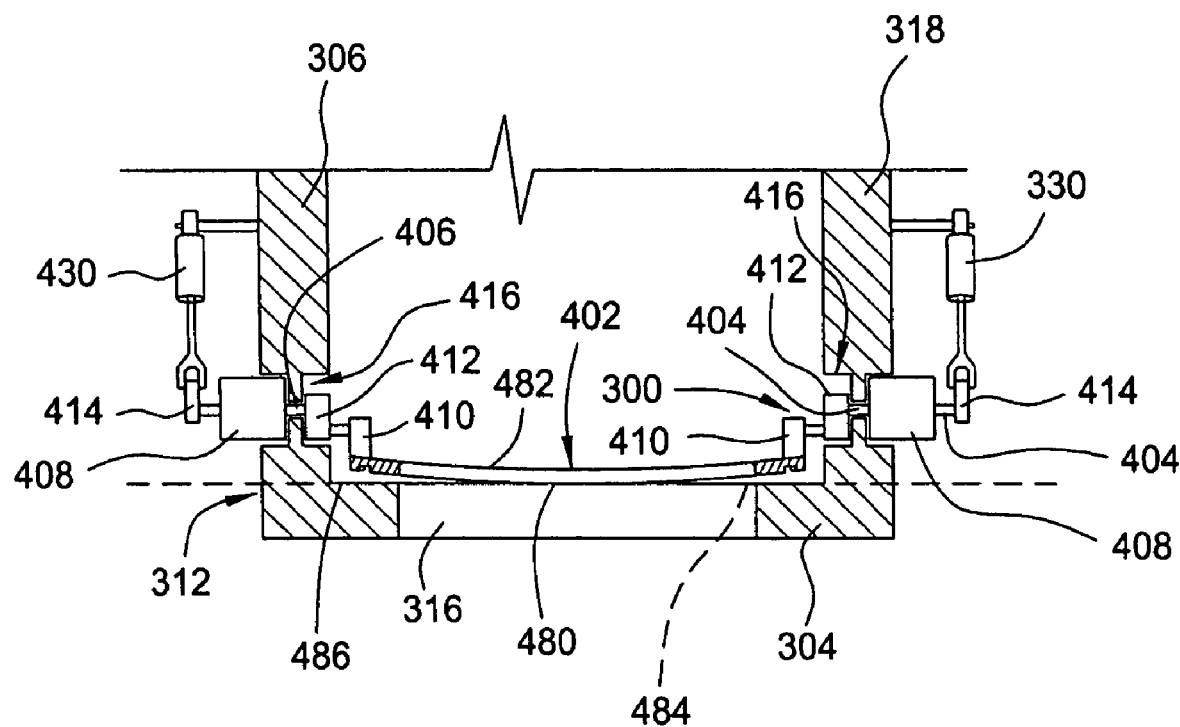
FIG. 4 is a sectional view of the load lock chamber taken along section lines 4-4 of FIG. 3.

FIG. 4 is a horizontal sectional view of the load lock chamber 200 through one of the slit valve door assemblies 300. The slit valve door assembly 300 includes a door member 402 positionable to selectively seal the passage 316. The door member 402 may have a conventionally flat sealing face, by a curved sealing face such as described in U.S. patent application Ser. No. 10/867,100, entitled "CURVED SLIT VALVE DOOR", filed Jun. 14. 2004 by YOSHIAKI TANASE et al., which is hereby incorporated by reference in its entirety.

In the embodiment depicted in FIG. 4, the door member 402 is coupled to a first shaft 404 and a second shaft 406. The shafts 404, 406 are coupled to the first actuator 330 and a second actuator 430. The first second actuators 330, 430 cooperate to rotate the door member 402. The first and second actuators 330, 430 may be a hydraulic cylinder, a pneumatic cylinder, motor or other actuator suitable for rotating the shafts 404, 406.

Each shaft 404, 406 is coupled to a mounting assembly 410 of the door member 402 by an internal actuator arm 412. Each shaft 404, 406 is also respectively coupled by an external actuator arm 414 to the actuators 330, 430. Each external actuator arm 414 and shaft 404, 406 may be splined, keyed or otherwise configured to prevent rotational slippage therebetween.

Each shaft 404, 406 passes through a seal pack assembly 408 that allows rotation of the shaft while maintaining the vacuum integrity of the chamber body 312. The seal pack assembly 408 is generally mounted to the exterior of the chamber body 312 to minimize the width and internal volume of the chamber body 312.

Figure 5:
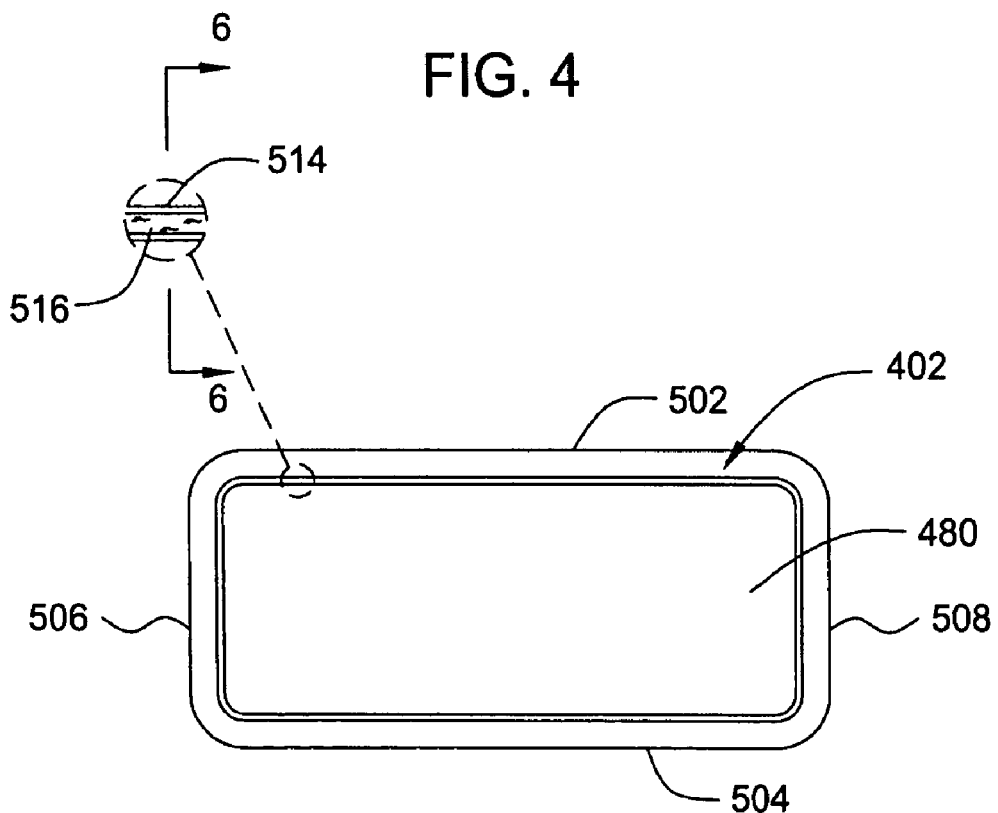
FIG. 5 is a plan view of one embodiment of a door member.

Referring additionally to the front view of the door member 402 depicted in FIG. 5, the door member 402 is generally elongated and is fabricated from aluminum or other suitable material. The door member 402 includes major sides 502, 504, minor sides 506, 508, the sealing face 480 and a backside 482. A respective one of mounting assemblies 410 is coupled to opposite ends of the backside 482 of the door member 402, proximate the minor sides 508, 510. In one embodiment, the door member 402 is rectangular and has a width between the minor sides 506, 508 of at least 1200 millimeters. It is contemplated that the door member 402 may be longer or shorter in width to accommodate substrates of different sizes.

As shown in FIG. 4, at least the sealing face 480 of the door member 404 is curved relative to an imaginary line 484 defined connecting the minor sides 506, 508 and parallel to a sealing surface 486 of the chamber body 316 to which the door member 402 seals. The sealing surface 486 and the sealing face 480 door member 402 are shown in an exaggerated spaced-apart relationship in FIG. 4 for clarity. The imaginary line 484 may also be parallel to the shafts 404, 406 and perpendicular to the minor sides 506, 508. In the embodiment depicted in FIG. 4, the sealing face 480 is convex relative to the line 484.

A seal gland 514 is formed in the sealing face 480 of the door member 402 inward of the sides 502, 504, 506, 508. The seal gland 514 circumscribes the center portion of the door member 402 that covers the substrate access port 316 through the chamber body 312. Alternatively, the gland 514 may be formed in the chamber body 312.

A seal 516 is disposed in the seal gland 514 and seals the door member 402 to the chamber body 316. The seal 516 is generally configured to prevent contact between the door member 402 and the chamber body 316 when compressed by the actuators 330, 430 and differential pressure between the two sides of the door member 402.

Figure 6:
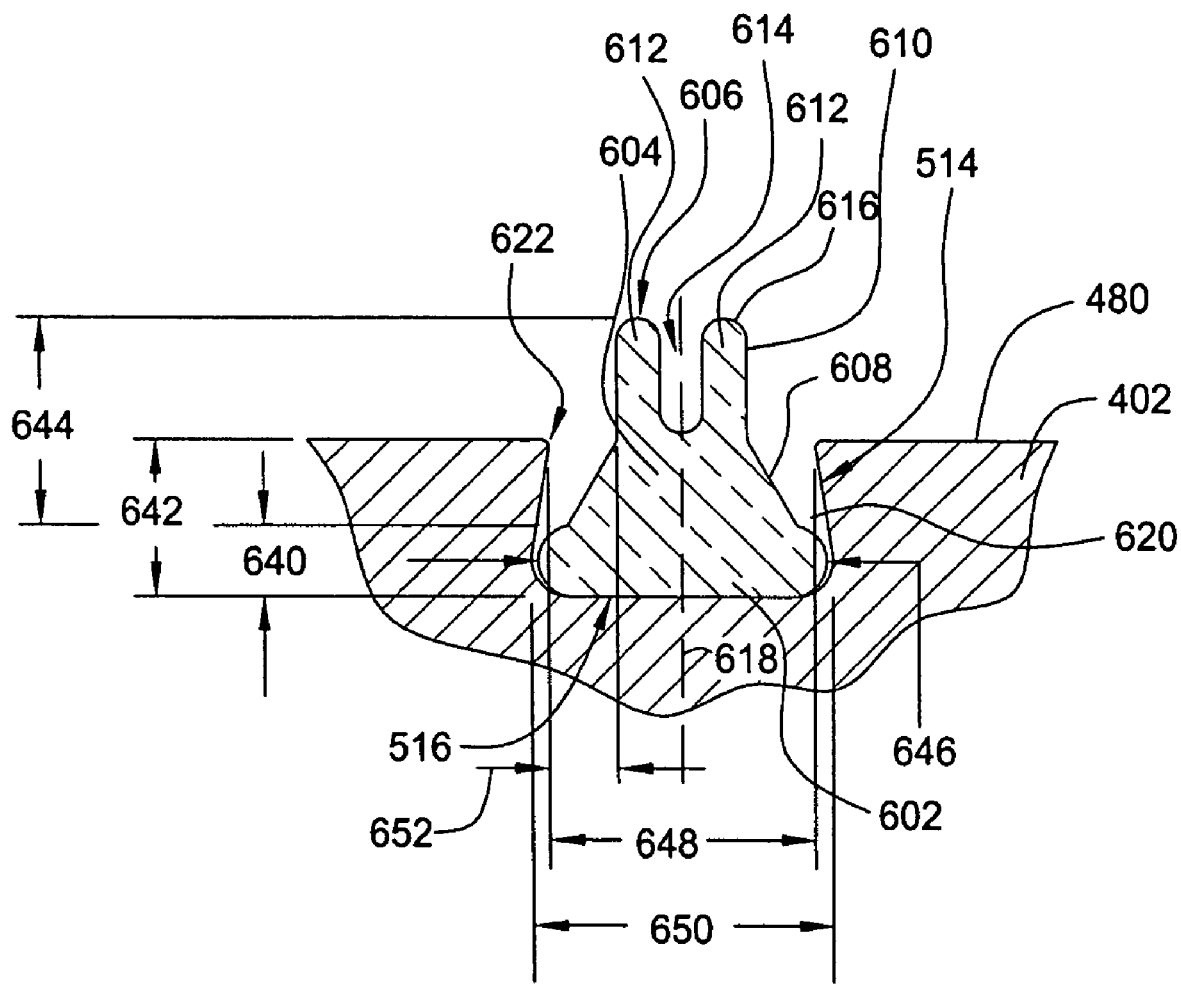
FIGS. 6-7 are partial sectional views of the door member of FIG. 5.

FIG. 6 depicts one embodiment of the seal 516 disposed in the gland 514 taken along section line 6-6 of FIG. 5. The seal 516 is generally includes a base 602 having a finger 604 extending therefrom. The base 602 and finger 604 generally comprise a single member fabricated from a low friction material, such as a fluoropolymer or fluorocarbon elastomer. The low friction material has a non-stick nature that allows the seal 516 to slide on the chamber body 316, thereby reducing particle generation and seal wear in the event of motion between the chamber body 316 and door member 402. In one embodiment, the seal 516 is comprised of polytetrafluoroethylene impregnated fluorocarbon, but suitable elastomeric materials compatible with semiconductor or flat panel display processes may be alternatively utilized. Some examples include fluorocarbon rubber materials such as VITON®, KALREZ®, CHEMREZ® and the like.

The base 602 has a ring shape configured to substantially circumscribe the port 316 covered by the door member 402. In one embodiment, the body 602 has a substantially rectangular ring shape, having a central axis (not shown) parallel to a cross-sectional center line 618.

The sectional shape of the base 602 is flattened relative to the cross-sectional center line 618 of the seal 516. The base 602 has a width 646 that is greater than a width 648 of the gland opening. As the width 646 of the base 602 is greater than the width gland opening 648, the seal 516 is captured in the gland 514 of the door member 402, thereby preventing the seal 516 from becoming disengaged from the gland 514 as the door member 402 moves.

The base 602 has a height 640 which is less than a gland depth 642, and substantially less than the width 648. In one embodiment, the body height 640 is about 50 percent of the gland depth 642.

The finger 604 generally tapers as it extends from the base 602 to a tip 606. At least a lower side wall 608 of the finger 604 is tapered such that the finger 606 defines a gap 652 with an edge 622 of the gland 514. An upper side wall 610 extends between the lower side wall 608 and the tip 606 of the finger 604. The upper side wall 610 may be tapered or parallel to the center line 618 of the seal 614. In one embodiment, the lower side wall 608 is inclined at an angle between 0 to about 90 degrees from the center line 618, and in another embodiment, is inclined at an angle of 13 degrees.

Figure 7:
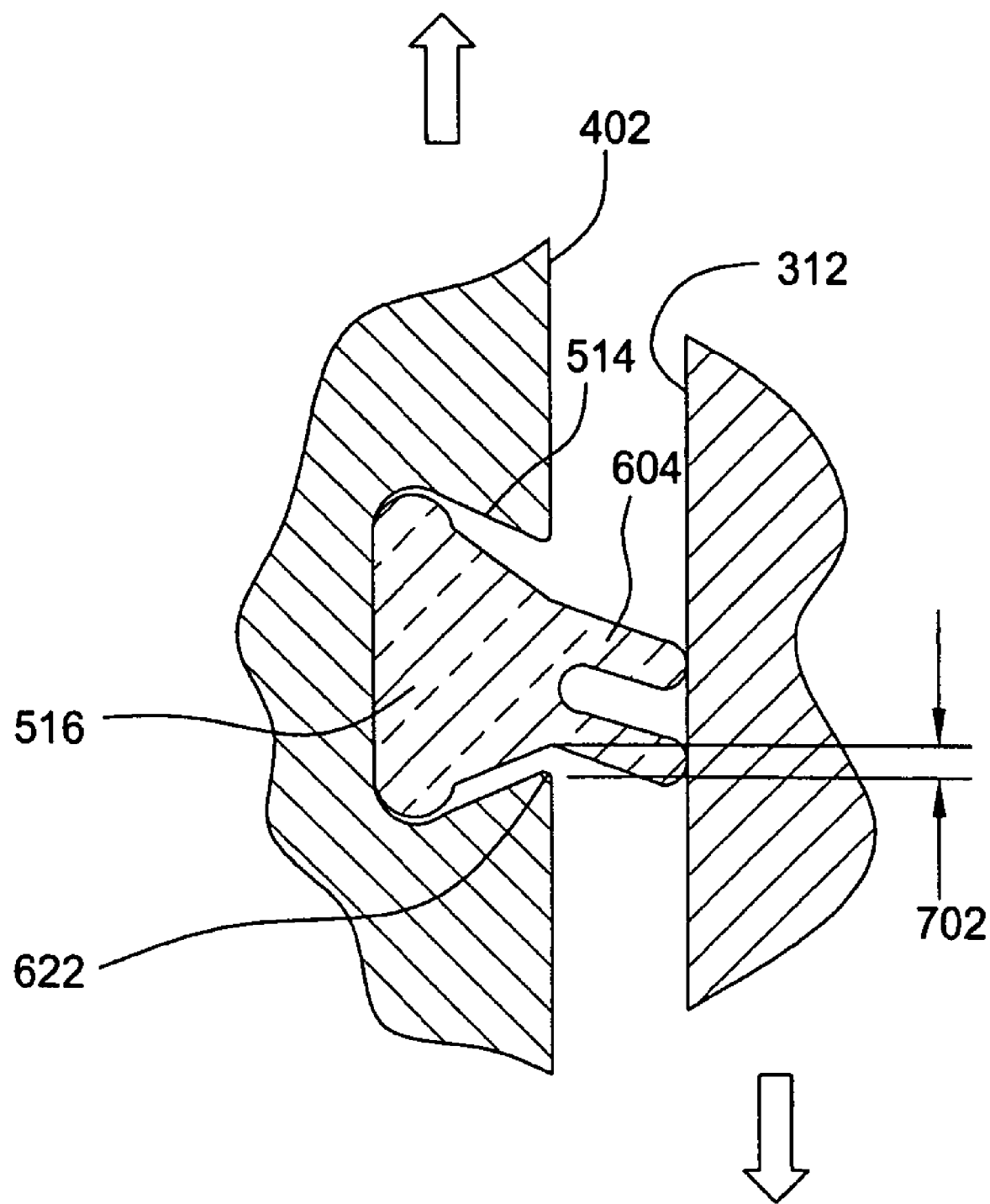

The tip 606 of the finger 604 may include one or more lips 612. Two lips 612 are shown in the embodiment depicted in FIG. 6 separated by a groove 614. The groove 614 is configured to enhance the lateral flexibility of the tip 606 of the finger 604 relative to the portion of the finger 604 defined between the lower sidewalls 608. A greater flexibility of the lip 612 allows the seal 516 to accommodate significant relative motion between the door member 402 and the chamber body 312 while maintaining a clearance 702 between the edge 622 of the gland 514 when the chamber body 312 is stressed (as shown in FIG. 7).

The finger 604 has a length 644 that allows the finger 604 to compress when urged against a chamber body 312 while maintaining sufficient clearance 702 to prevent contact between the seal 516 and the gland edges 622, thereby compensating for the compression and lateral deflection of the seal 516 as the door member 402 and the chamber body 312 move. This configuration prevents the gland 514 from pinching the seal 516 as the door member 402 and the chamber body 312 move relative to each other, thereby substantially eliminating seal abrasion and particle generation.

The lips 612 additionally have a rounded sealing surface 616. The rounded sealing surface 616 further accommodates the movement between the door member 402 and the chamber body 312 as the rounded sealing surface 616 readily slides over the chamber body 312 while maintaining vacuum integrity of the seal. The low friction materials of the seal 516 additionally facilitate movement of the lip 612 along the chamber body 312 without particle generation.

Thus, a seal for a slit valve door member has been provided that advantageously accommodates motion between the door member and chamber body. It is also contemplated that the seal may be utilized between other chamber components, such as between the chamber body and a lid or other member utilized to access the interior of the chamber body. The seal additionally is configured to maintain clearance between the edges of the seal gland when compressed and laterally deflected. As the seal remains clear of the edge of the gland, the life and performance of the seal is advantageously extended.

While the foregoing is directed to the preferred embodiment of the present invention, other and further embodiments of the invention may be devised without departing from the basic scope thereof, and the scope thereof is determined by the claims that follow.

What is claimed is:

1. A chamber comprising:
   a chamber body having a first access port formed therethrough;
   a first door member selectively closing the first access port; and
   a door seal configured for sealing the first access port and for accommodating relative motion between the first door member and the chamber body when the first door member closes the first access port, wherein the door seal is captured in a gland formed in at least one of the chamber body and the first door member, the door seal comprises:
   a ring-shaped base engaged in the gland, the ring-shaped base having a center axis and a width greater than an opening width of the gland; and
   at least one finger extending from the ring-shaped base and oriented substantially parallel to the center axis, wherein the at least one finger is configured to prevent the first door member from contacting the chamber body.

2. The chamber of claim 1, wherein the door seal is fabricated from a material selected from a group consisting of fluoropolymers, fluorocarbon elastomer, polytetrafluoroethylene impregnated fluorocarbon, and fluorocarbon rubber.

3. The chamber of claim 1, wherein the ring-shaped base has a width greater than a height, wherein the height is parallel to the center axis.

4. The chamber of claim 1, wherein the ring-shaped base is a substantially rectangular ring relative to a plane defined perpendicular to the center axis.

5. The chamber of claim 1, wherein the at least one finger is tapered from the ring-shaped base.

6. The chamber of claim 1, wherein the at least one finger comprises a plurality of lips defined at a tip of the at least one finger, the plurality of lips are configured to enhance lateral flexibility of the tip of the at least one finger to allow the door seal to accommodate significant relative motion between the first door member and the chamber body.

7. The chamber of claim 6, wherein each of the plurality of lips comprises a curved sealing surface.

8. The chamber of claim 6, wherein each of the plurality of lips is separated by a groove.

9. The chamber of claim 8, wherein the groove extends partially through the at least one finger towards the ring-shaped base.

10. The chamber of claim 1 further comprising:
    a substrate transfer chamber formed in the chamber body and coupled to the first access port;
    a second access port formed through the chamber body and fluidly coupled to the substrate transfer chamber;
    a second door member selectively sealing the second access port; and
    a pressure control system coupled to the substrate transfer chamber for venting and pumping down an environment of the substrate transfer chamber.

11. The chamber of claim 10, further comprising:
    a second substrate transfer chamber formed in the chamber body vertically stacked over the first substrate transfer chamber.

12. The chamber of claim 11, wherein each of the second substrate transfer chamber and the first substrate transfer chamber accommodates a single substrate.

13. The chamber of claim 1, wherein the first door member has a substantially flat sealing surface.

14. The chamber of claim 1, wherein the first door member has a curved sealing surface.

15. The chamber of claim 1, wherein the first access port is a substrate access port.

16. The chamber of claim 1, wherein the first door member is a lid of the chamber body.

17. The chamber of claim 1, wherein the ring-shaped base has a width narrower than a bottom width of the gland.

18. The chamber of claim 1, wherein the ring-shaped base has a height less than a depth of the gland.

19. The chamber of claim 1, wherein the ring-shaped base has a height less than half of a depth of the gland.

20. The chamber of claim 5, wherein the at least one finger has inclined sidewalls inclined at an angle between about 0 degree to about 90 degree from the center axis.

21. The chamber of claim 20, wherein the angle is about 13 degree.

22. The chamber of claim 5, wherein the tapered at least one finger defines a gap between the door seal and an edge of the gland.

* * * * *

UNITED STATES PATENT AND TRADEMARK OFFICE
CERTIFICATE OF CORRECTION

PATENT NO. : 7,282,097 B2  Page 1 of 1
APPLICATION NO. : 10/867344
DATED : October 16, 2007
INVENTOR(S) : Yoshiaki Tanase, William Norman Sterling and Paul Andrew Haworth It is certified that error appears in the above-identified patent and that said Letters Patent is hereby corrected as shown below:

Column 2, line 55, should read --member; and--

Signed and Sealed this

Sixth Day of May, 2008

JON W. DUDAS
*Director of the United States Patent and Trademark Office*